United States Patent
Noh (10) Patent No.: US 8,665,369 B2
(45) Date of Patent: Mar. 4, 2014

(54) SIGNAL PROCESSING APPARATUS FOR APPLYING AVC TO DELAYED SIGNALS AND A METHOD THEREOF

(75) Inventor: Dae-kyoung Noh, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1381 days.

(21) Appl. No.: 12/040,148

(22) Filed: Feb. 29, 2008

(65) Prior Publication Data

US 2009/0021640 A1    Jan. 22, 2009

(30) Foreign Application Priority Data

Jul. 16, 2007   (KR) .................. 10-2007-0071319

(51) Int. Cl.
   *H04N 9/475*   (2006.01)
(52) U.S. Cl.
   USPC .......................................... 348/515; 381/107
(58) Field of Classification Search
   USPC ........... 348/515, 738; 381/104, 106–107, 110
   See application file for complete search history.

(56) References Cited

U.S. PATENT DOCUMENTS

| | | | |
|---|---|---|---|
| 5,303,374 A | * | 4/1994 | Mitsuhashi et al. ........... 704/212 |
| 2004/0002313 A1 | * | 1/2004 | Peace et al. ................ 455/234.1 |
| 2006/0018493 A1 | * | 1/2006 | Oh et al. ........................ 381/107 |
| 2008/0152041 A1 | * | 6/2008 | Meyer ........................... 375/324 |
| 2008/0253586 A1 | * | 10/2008 | Wei ............................... 381/107 |

FOREIGN PATENT DOCUMENTS

| | | |
|---|---|---|
| GB | 2201310 A | 8/1988 |
| JP | 2007-053661 A | 3/2007 |
| WO | 01/26221 A1 | 4/2001 |
| WO | 2008/21110 A2 | 2/2008 |

OTHER PUBLICATIONS

Extended European Search Report issued on Jul. 14, 2011 in counterpart European Application No. 08153646.8.
Communication dated Aug. 8, 2013 from the Korean Intellectual Property Office in a counterpart application No. 10-2007-0071319.

* cited by examiner

*Primary Examiner* — Ngoc Vu
(74) *Attorney, Agent, or Firm* — Sughrue Mion, PLLC (57) ABSTRACT

A signal processing apparatus and method are provided. The signal processing apparatus adjusts the level of a certain signal from among sequentially input signals based on the levels of the signals, and the certain signal is one of signals input prior to the latest signal input to the adjusting unit. Accordingly, a storage cell is shared for lip-sync and AVC, resulting in reduced manufacturing costs, and enhanced stabilization of the signal and the rate of the stabilization of the signal.

18 Claims, 8 Drawing Sheets

SIGNAL PROCESSING APPARATUS FOR APPLYING AVC TO DELAYED SIGNALS AND A METHOD THEREOF

CROSS-REFERENCE TO RELATED APPLICATIONS

This application claims priority under 35 U.S.C. §119 from Korean Patent Application No. 10-2007-0071319, filed on Jul. 16, 2007, in the Korean Intellectual Property Office, the disclosure of which is incorporated herein by reference in its entirety.

BACKGROUND OF THE INVENTION

1. Field of the Invention

Apparatuses and methods consistent with the present invention relate to providing a signal processing apparatus and a method thereof, and more particularly, to providing a signal processing apparatus for adjusting and outputting levels of input signals and a method thereof.

2. Description of the Related Art

Digital televisions are a representative form of audio/video apparatus which display movies on a screen. Digital televisions divide received broadcast signals into video signals and audio signals, and processes the video signals and audio signals separately.

Figure 1:
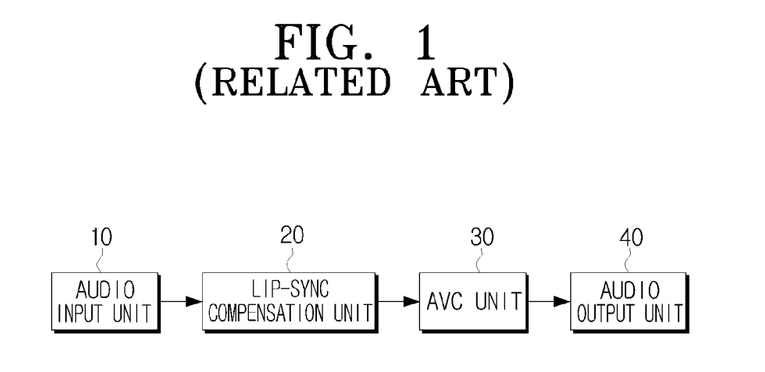
FIG. 1 illustrates a conventional audio processor.

FIG. 1 illustrates an audio processor of a digital television for processing separated audio signals. In FIG. 1, a conventional audio processor comprises an audio input unit 10, a lip-sync compensation unit 20, an auto volume control (AVC) unit 30, and an audio output unit 40.

The lip-sync compensation unit 20 delays audio signals input from the audio input unit 10 in order to synchronize video signals and audio signals.

The AVC unit 30 automatically adjusts levels of audio signals and outputs the adjusted audio signals to the audio output unit 40. Specifically, the AVC unit 30 automatically adjusts the level of a currently input audio signal by referring levels of previously input audio signals.

The AVC unit 30 automatically adjusts levels of audio signals so as to appropriately output audio signals by automatically adjusting volume when input of audio signals is changed, for example, when a channel is changed.

The lip-sync compensation unit 20 embeds a memory which is necessary to delay audio signals. The AVC unit 30 also has a memory device which stores previously input audio signals in order to adjust the level of a currently input audio signal.

Since the lip-sync compensation unit 20 and the AVC unit 30 require memory devices, the audio processor requires many memory devices, resulting in increased manufacturing costs.

Moreover, at the time when the channel is changed, the AVC unit 30 does not have previously input audio signals. Therefore, the result of audio volume control of audio signals input to the audio processor is not satisfactory initially when the channel is changed.

SUMMARY OF THE INVENTION

Exemplary embodiments of the present invention address at least the above problems and/or disadvantages and other disadvantages not described above. Also, the present invention is not required to overcome the disadvantages described above, and an exemplary embodiment of the present invention may not overcome any of the problems described above.

The present invention provides a signal processing apparatus which shares a storage cell for lip-sync and AVC, and a method thereof.

In addition, the present invention provides a signal processing apparatus which adjusts the level of a certain signal using signals sequentially following the certain signal, and a method thereof.

Furthermore, the present invention provides an audio apparatus and an audio/video apparatus which provides users with superior audio and video.

According to an exemplary aspect of the present invention, there is provided a signal processing apparatus including an adjusting unit which adjusts a certain signal by adjusting a signal level of the certain signal from among sequentially input signals, based on signal levels of the sequentially input signals, and an output unit which outputs the adjusted certain signal, wherein the certain signal is one of sequentially input signals input into the adjusting unit prior to an input of a latest signal of the sequentially input signals.

The adjusting unit may store the sequentially input signals in First In First Out (FIFO) manner, and the certain signal may be an earliest input signal from among the sequentially input signals which are input and stored in the adjusting unit.

The certain signal may be an audio signal.

The sequentially input signals may be sequentially input audio signals, the adjusting unit includes a delay unit which delays and stores the sequentially input audio signals, and a level adjusting unit which adjusts the signal level of the audio signal which is delayed for a period of time in the delay unit and output, wherein the period of time is a period in which the audio signal is delayed to synchronize the sequentially input audio signals and video signals of moving images.

The adjusting unit may include a delay unit which delays and stores the sequentially input signals, a calculation unit which calculates a gain for the certain signal based on the sequentially input signals stored in the delay unit, and a level adjusting unit which applies the calculated gain to the certain signal output from the delay unit.

The delay unit may include storage units where the sequentially input signals are delayed and stored, and the storage units are implemented in at least one of hardware and software.

The adjusting unit may adjust the signal level of the certain signal from among the sequentially input signals based on weighted levels which are applied to the signal levels of the sequentially input signals.

According to another exemplary aspect of the present invention, there is provided a signal processing method including adjusting a certain signal by adjusting a signal level of the certain signal from among sequentially input signals, based on signal levels of the sequentially input signals, and outputting the adjusted certain signal, wherein the certain signal is one of the sequentially input signals input prior to an input of a latest input signal of the sequentially input signals.

In the adjusting, the sequentially input signals may be stored in First In First Out (FIFO) manner, and the certain signal may be an earliest input signal from among the sequentially input signals which are input and stored in the adjusting.

The certain signal may be an audio signal.

The sequentially input signals may be sequentially input audio signals, the adjusting includes delaying and storing the sequentially input audio signals, and adjusting the signal level of the certain audio signal which is delayed for a period of time in the delaying and output, wherein the period of time is a period in which the certain audio signal is delayed to synchronize the sequentially input audio signals and video signals of moving images.

The adjusting may include delaying and storing the sequentially input signals, calculating a gain for the certain signal based on the stored sequentially input signals, and applying the calculated gain to the certain signal.

In the adjusting, the signal level of the certain signal from among the sequentially input signals may be adjusted based on weighted levels which are applied to the signal levels of the sequentially input signals.

The adjusting and the outputting may be performed by one of a signal processing apparatus, an audio apparatus, an audio/video apparatus, a television, and a set-top box.

According to another exemplary aspect of the present invention, there is provided a audio apparatus which processes and outputs audio signals, the apparatus including an adjusting unit which adjusts a certain audio signal by adjusting an audio signal level of the certain audio signal from among sequentially input audio signals based on signal levels of the sequentially input audio signals, and an output unit which outputs the adjusted certain audio signal, wherein the certain audio signal is one of the sequentially input audio signals input into the adjusting unit prior to a latest audio signal of the sequentially input audio signals.

According to another exemplary aspect of the present invention, there is provided an audio/video apparatus which processes and outputs audio signals and video signals, the apparatus including an adjusting unit which adjusts a certain signal by adjusting an audio signal level of the certain audio signal from among sequentially input audio signals based on audio signal levels of the sequentially input audio signals, and an output unit which outputs the adjusted certain audio signal, wherein the certain audio signal is one of audio signals of the sequentially input audio signal input into the adjusting unit prior to a latest audio signal of the sequentially input audio signals.

The audio/video apparatus may be one of a television, a set-top box, and a broadcast receiving apparatus.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF EXEMPLARY EMBODIMENTS OF THE PRESENT INVENTION

Certain exemplary embodiments of the present invention will now be described in greater detail with reference to the accompanying drawings.

In the following description, the same drawing reference numerals are used for the same elements even in different drawings. The matters defined in the description, such as detailed construction and elements, are provided to assist in a comprehensive understanding of the invention. Thus, it is apparent that the present invention can be carried out without those specifically defined matters. Also, well-known functions or constructions are not described in detail since they would obscure the invention with unnecessary detail.

Figure 2:
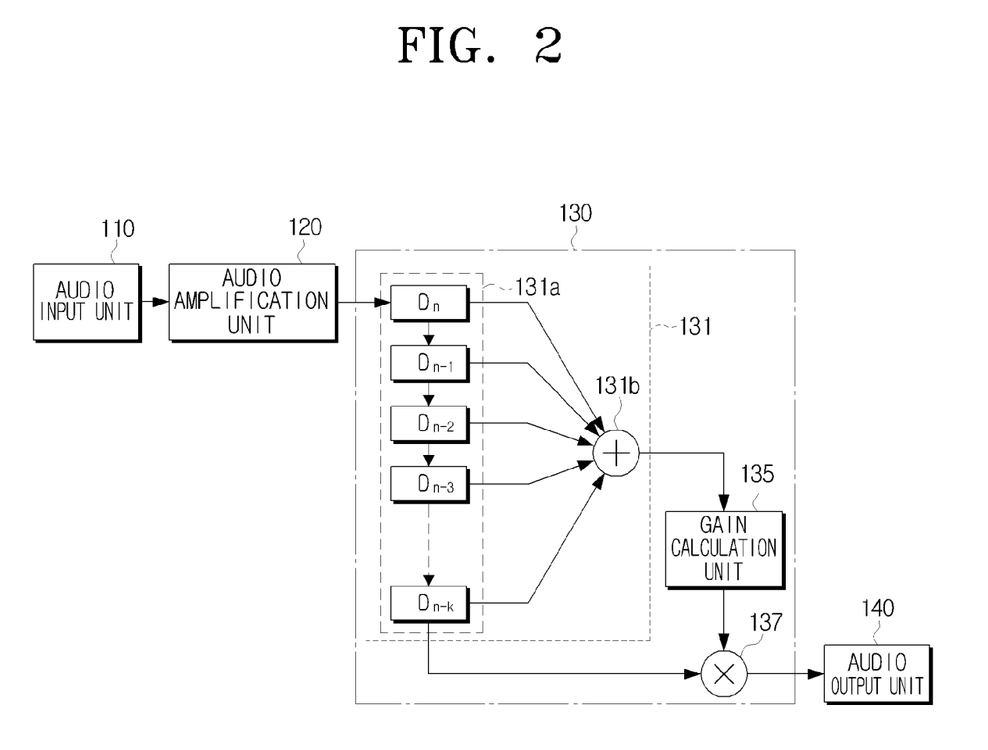
FIG. 2 is a block diagram illustrating an audio signal processing apparatus according to the first exemplary embodiment of the present invention.

FIG. 2 is a block diagram illustrating an audio signal processing apparatus according to the first exemplary embodiment of the present invention. In FIG. 2, the audio signal processing apparatus comprises an audio input unit 110, an audio amplification unit 120, an audio adjusting unit 130, and an audio output unit 140.

The audio input unit 110 receives audio signals from a connected external element or an external device.

The audio amplification unit 120 amplifies and outputs audio signals input from the audio input unit 110. The audio amplification unit 120 is provided in case the level of an audio signal input from the audio input unit 110 is very low. Accordingly, if the level of an input audio signal is comparatively high due to low attenuation, the audio amplification unit 120 can be omitted.

The audio adjusting unit 130 performs lip-sync and auto volume control (AVC) together. Lip-sync is matching audio signals with video signals. AVC is outputting appropriate audio by automatically adjusting the volume when input audio signals are changed, for example, when the channel, frequency, or reproduced file is changed.

The audio adjusting unit 130 comprises a level detection unit 131, a gain calculation unit 135, and a level adjusting unit 137.

The level detection unit 131 detects the average level of audio signals over a certain period of time, that is, the average level of audio signals input to the level detection unit 131 during such a period of time. The level detection unit 131 comprises a delay unit 131a, and a root mean square (RMS) calculation unit 131b.

The delay unit 131a stores audio signals sequentially input from the audio amplification unit 120 in the First In First Out (FIFO) manner. Accordingly, among audio signals input and stored to the delay unit 131a, the earliest input audio signal and subsequent audio signals are sequentially output to the level adjusting unit 137.

As shown in FIG. 2, the delay unit 131a comprises delays $D_n, D_{n-1}, D_{n-2}, D_{n-3}, \ldots,$ and $D_{n-k}$, of the number of k+1. The delays $D_n, D_{n-1}, D_{n-2}, D_{n-3}, \ldots,$ and $D_{n-k}$ are storage units which store audio signals sequentially input from the amplification unit 120 to delay the input audio signals. The storage units may be implemented with software as well as hardware.

Accordingly, the audio signals input to the delay unit 131a are delayed by passing the first delay $D_n$, the second delay $D_{n-1}$, the third delay $D_{n-2}$, the fourth delay $D_{n-3}, \ldots,$ and the $(k+1)^{th}$ delay $D_{n-k}$, and are finally output to the level adjusting unit 137.

The delay time of the input audio signals depends on the number of delays $D_n, D_{n-1}, D_{n-2}, D_{n-3}, \ldots,$ and $D_{n-k}$. That is, the delay time is determined by k, so if k is high, the delay time is long, and if k is low, the delay time is short. Also, k is a value to set sync between input audio signals and video signals, and can be determined by experimentation.

The RMS calculation unit 131b calculates an RMS value for the audio signals stored in the delay unit 131a. In more detail, the RMS calculation unit 131b calculates the square root of the sum of the square of the audio signals stored in the delays $D_n, D_{n-1}, D_{n-2}, D_{n-3}, \ldots,$ and $D_{n-k}$.

The gain calculation unit 135 calculates a gain to be applied to an audio signal (that is, an audio signal stored in $(k+1)^{th}$ delay $D_{n-k}$) output from the delay unit 131a to the level adjusting unit 137 with reference to the RMS value calculated by the RMS calculation unit 131b.

Figure 3:
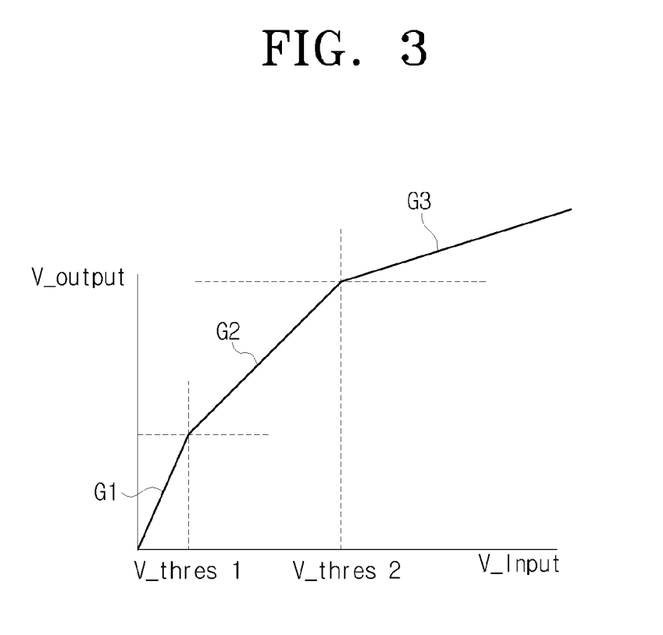
FIG. 3 is a graph used to calculate a gain to be applied to delayed audio signals.

More specifically, the gain calculation unit 135 calculates $G_i$ using the RMS value output by the RMS calculation unit 131b and using the graph of FIG. 3. In FIG. 3, 1) if the RMS value (V_Input) is lower than a first threshold value (V_thres1), $G_i$ is $G_1$ (the inclination of the graph in V_Input between 0 and V_thres1), 2) if the RMS value (V_Input) is equal to or greater than the first threshold value (V_thres1) and lower than a second threshold value (V_thres2), $G_i$ is $G_2$ (the slope of the graph in V_Input between V_thres1 and V_thres2), and 3) if the RMS value (V_Input) is equal to or greater than the second threshold value (V_thres2), $G_i$ is $G_3$ (the slope of the graph in V_Input over V_thres2).

Moreover, the gain calculation unit 135 calculates $G_O$ using the level of the audio signal (that is, the audio signal stored in $(k+1)^{th}$ delay $D_{n-k}$) output from the delay unit 131a to the level adjusting unit 137 and using the graph of FIG. 3. Since $G_O$ is calculated in the same manner as $G_i$ is calculated, detailed description is omitted.

Subsequently, the gain calculation unit 135 calculates a gain G to be applied to audio signals output from the delay unit 131a to the level adjusting unit 137 by putting calculated $G_i$ and $G_O$ into Equation 1.

$$G=G_i+(G_o-G_i)*\exp(-(t+k)/T) \quad \text{[Equation 1]}$$

Where k is a value which is one lower than a number k+1 of the delays in the delay unit 131a, and T is a time constant which is determined considering k.

The level adjusting unit 137 adjusts the levels of audio signals which are delayed and output from the delay unit 131a. In greater detail, the level adjusting unit 137 adjusts the level of the audio signals by multiplying the level of an audio signal output from $(k+1)^{th}$ delay $D_{n-k}$ by the gain calculated by the gain calculation unit 135.

The level adjusting unit 137 adjusts the levels of audio signals which are delayed and output from the delay unit 131a. In greater detail, the level adjusting unit 137 adjusts the level of the audio signals by multiplying the level of an audio signal output from (k+1)th delay $D_{n-k}$ by the gain calculated by the gain calculation unit 135.

The audio output unit 140 outputs the level adjusted audio signal output by the level adjusting unit 137 to an external element or an external device.

Figure 4:
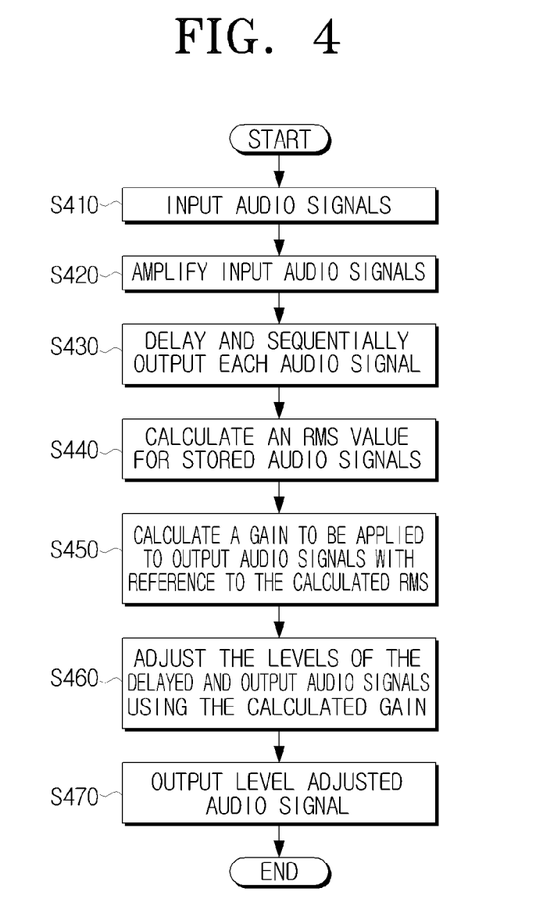
FIG. 4 is a flow chart illustrating an audio signal processing method according to the first exemplary embodiment of the present invention.

An audio signal processing method of the audio signal processing apparatus of FIG. 2 is described in detail with reference to FIG. 4. FIG. 4 is a flow chart illustrating an audio signal processing method according to the first exemplary embodiment of the present invention.

As shown in FIG. 4, the audio input unit 110 receives audio signals from a connected external element or external apparatus in operation S410. The audio amplification unit 120 amplifies and outputs the audio signals input from the audio input unit 110 in operation S420.

The delay unit 131a in the level detection unit 131 of the audio adjusting unit 130 delays the audio signals sequentially input from the audio amplification unit 120, and sequentially outputs the audio signals in operation S430.

The RMS calculation unit 131b in the level detection unit 131 of the audio adjusting unit 130 calculates an RMS value for the audio signals stored in the delay unit 131a in operation S440.

The gain calculation unit 135 calculates a gain to be applied to an audio signal (that is, an audio signal stored in $(k+1)^{th}$ delay $D_{n-k}$) output from the delay unit 131a to the level adjusting unit 137 with reference to the calculated RMS value in operation S450.

The level adjusting unit 137 adjusts the levels of the audio signals, which is delayed and output from the delay unit 131a, using the calculated gain in operation S460.

Subsequently, the audio output unit 140 outputs the level adjusted audio signals to the connected external element or external apparatus in operation S470.

An audio signal processing apparatus which performs lip-sync and AVC functions together by delaying audio signals and adjusting the levels of the audio signal was described in detail using the first exemplary embodiment.

In the first exemplary embodiment, audio signals are delayed for a certain period of time using delays to the value of k+1, and the levels of the delayed and output audio signals are adjusted. Accordingly, a gain applied to adjust the levels of the audio signals is acquired using Equation 1.

However, in a conventional audio signal processing apparatus which adjusts the levels of audio signals for AVC without delaying the audio signals, a gain G applied to adjust the levels of the audio signals is acquired using the following Equation 2.

$$G=G_i+(G_o-G_i)*\exp(-t/T) \quad \text{[Equation 2]}$$

Figure 5:
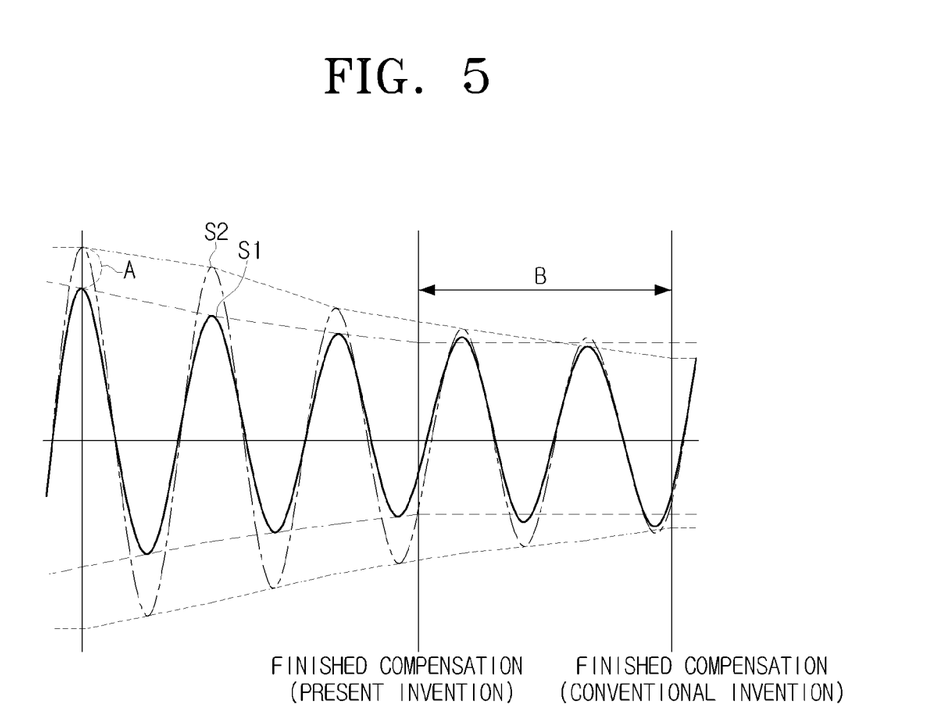
FIG. 5 is a graph to compare performance of an audio signal processing apparatus according to the first exemplary embodiment of the present invention and a conventional audio signal processing apparatus.

Consequently, the audio signal processing apparatus using Equation 1 and the conventional audio signal processing apparatus using Equation 2 have differences in AVC performance as shown in FIG. 5.

That is, in FIG. 5, the time necessary to stabilize audio signals in the audio signal processing apparatus S1 according to the present invention is shorter than the conventional audio signal processing apparatus S2 by interval ⌈B,⌋ when the audio signals are changed, for example, when a channel, frequency, or reproduced file is changed. In addition, FIG. 5 shows that the audio signal processing apparatus S1 according to the present invention has a compensation level which is more than the conventional audio signal processing apparatus S2 by interval ⌈A,⌋ when the changed audio signals begin to be output.

These differences result from the situation that audio signal processing apparatus according to the present invention delays audio signals for a certain period of time using delays of the value of k+1, and adjusts the levels of the delayed and output audio signals.

In the first exemplary embodiment, AVC is carried out by adjusting and outputting the level of the earliest input audio signal (that is, an audio signal stored in $(k+1)^{th}$ delay $D_{n-k}$) from among the audio signals stored in the delay unit 131a of the level detection unit 131 of the audio adjusting unit 130.

However, this is merely an exemplary embodiment to facilitate description. Even when an audio signal output from the delay unit 131a may be not the earliest input audio signal but another signal (except for the latest input audio signal), the technical idea of the present invention can be applied. In other words, an audio signal output from the delay unit may be one of the audio signals input prior to the latest input audio signal.

In more detail, AVC can be carried out by adjusting and outputting the levels of audio signals stored in the second delay $D_{n-1}$, the third delay $D_{n-2}$, the fourth delay $D_{n-3}$, ..., and $k^{th}$ delay $D_{n-(k-1)}$ except for the audio signal stored in $(k+1)^{th}$ delay $D_{n-k}$.

When the RMS calculation unit 131b calculates an RMS value for the audio signals stored in the delay unit 131a, the RMS value may be calculated by giving weight to each level of the audio signals stored in the delays $D_n$, $D_{n-1}$, $D_{n-2}$, $D_{n-3}$, ..., and $D_{n-k}$.

Figure 6:
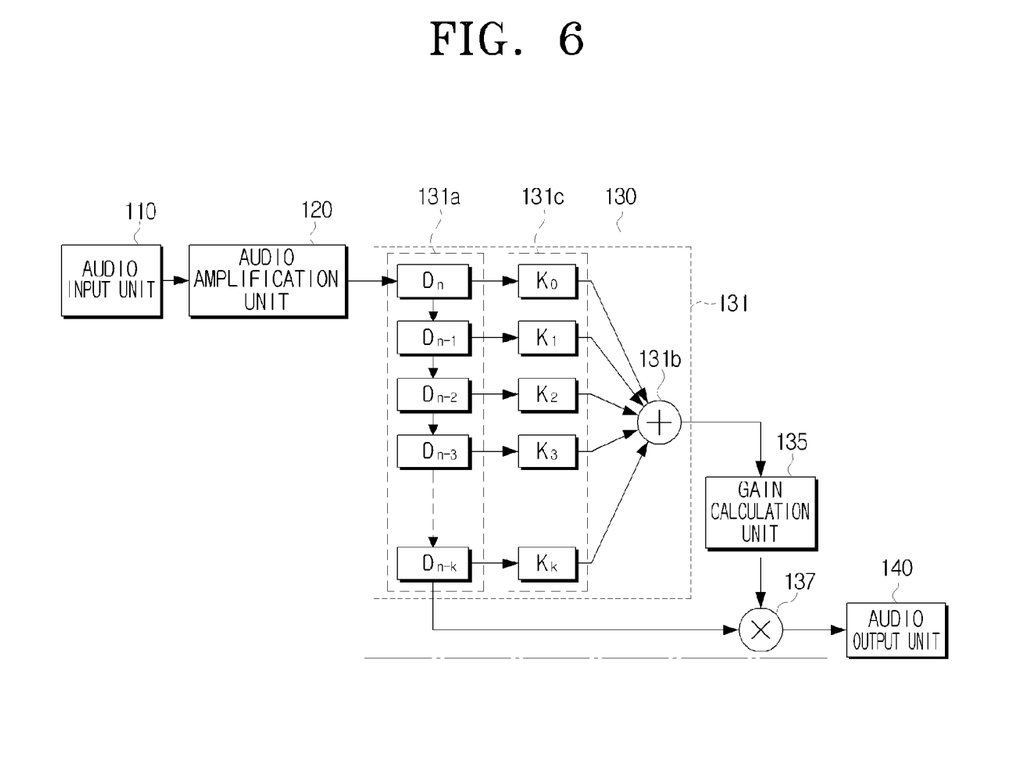
FIG. 6 is a block diagram illustrating an audio signal processing apparatus according to the second exemplary embodiment of the present invention.

To this end, as shown in FIG. 6, the audio adjusting unit 130 may include a weight unit 131c which applies weight to each level of the audio signals stored in the delays $D_n$, $D_{n-1}$, $D_{n-2}$, $D_{n-3}$, ..., and $D_{n-k}$.

The weights $K_0$, $K_1$, $K_2$, $K_3$, ..., $K_k$, which are applied to the delays $D_n$, $D_{n-1}$, $D_{n-2}$, $D_{n-3}$, ..., and $D_{n-k}$, respectively, may be different, so for example, the weights in size can be $K_k > \ldots > K_3 > K_2 > K_1 > K_0$.

The graph of FIG. 3 which is used to calculate a gain by the gain calculation unit 135 is merely an example to facilitate description. Accordingly, the gain calculation unit 135 may calculate the gain using other graphs, such as a graph with a different inclination, a graph having a single threshold value or three threshold values, or the like.

Furthermore, the audio signal processing apparatus presented in the first exemplary embodiment is an apparatus which receives and outputs digital audio signals. However, the present invention is not limited thereto, and the technical idea of the present invention can also be applied to audio signal processing apparatuses which receive and output analog audio signals. In this case, the audio signal processing apparatuses further include an analog to digital converter (ADC) and a digital to analog converter (DAC).

In the first exemplary embodiment, the audio adjusting unit 130 carries out lip-sync and AVC functions together, but the present invention is not limited thereto. The audio adjusting unit 130 may perform only the AVC function, but in this case, k can be determined to be a value appropriate for AVC. When k is determined, lip-sync does not need to be considered.

In the first exemplary embodiment, an audio signal processing apparatus is presented as an example, but the technical idea of the present invention can be applied to a video signal processing apparatus to process video signals. In other words, the technical idea of the present invention can be applied to a video signal processing apparatus which adjusts the level of a certain video signal using video signals sequentially following the certain signal.

The audio signal processing apparatus as described above can be mounted in an audio/video apparatuses to provide users with moving images, or in an audio apparatus to output audio through a speaker and an audio output element.

Figure 7:
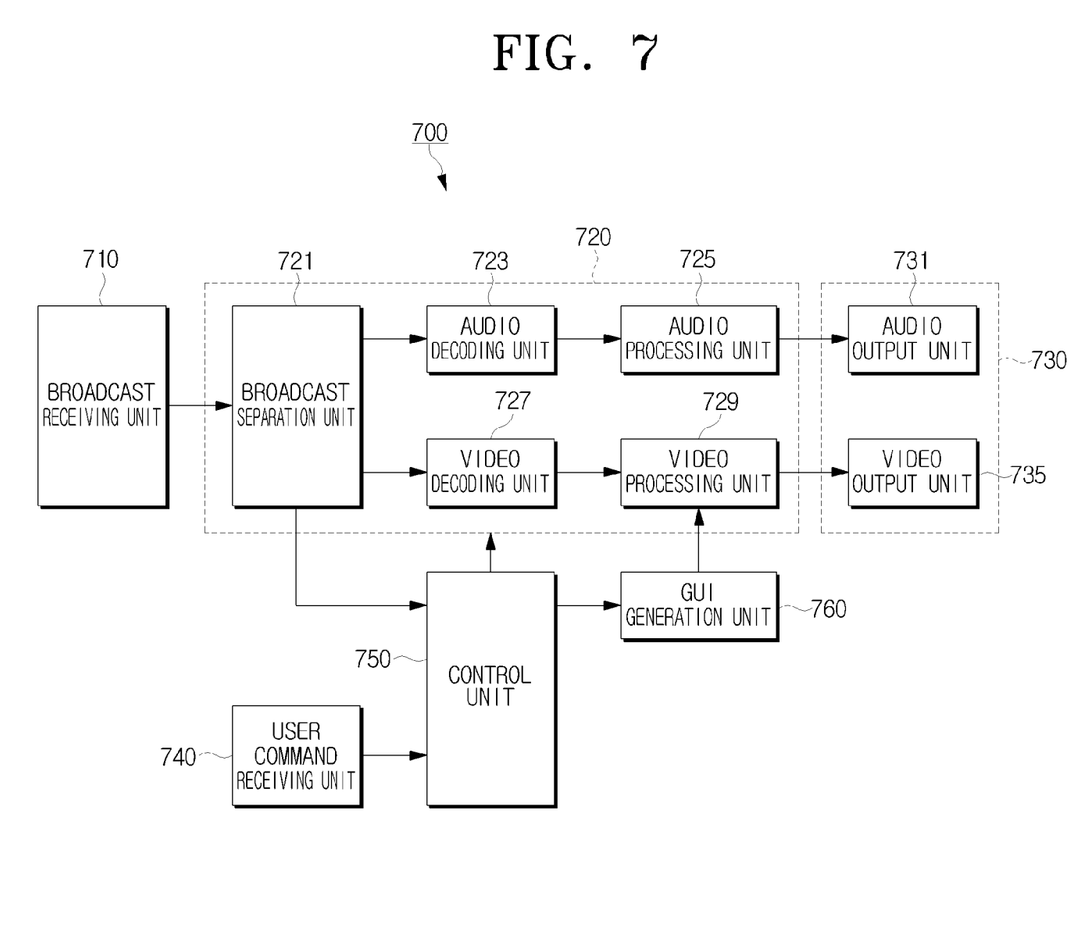
FIG. 7 is a block diagram illustrating a digital television according to the third exemplary embodiment of the present invention.

Broadcast receiving apparatuses, such as televisions and set-top boxes, represent audio/video apparatuses. FIG. 7 illustrates a diagram of a digital television 700 as an example of an audio/video apparatus. In FIG. 7, the digital television 700 comprises a broadcast receiving unit 710, a broadcast processing unit 720, an output unit 730, a user command receiving unit 740, a control unit 750, and a graphic user interface (GUI) generation unit 760.

The broadcast receiving unit 710 tunes the digital television 700 to a broadcast, and demodulates the broadcast. The broadcast processing unit 720 processes a broadcast signal output from the broadcast receiving unit 710.

The broadcast processing unit 720 comprises a broadcast separation unit 721, an audio decoding unit 723, an audio processing unit 725, a video decoding unit 727, and a video processing unit 729.

The broadcast separation unit 721 separates the broadcast signal output from the broadcast receiving unit 710 into an audio signal, a video signal, and additional data.

The audio decoding unit 723 decodes the audio signal output from the broadcast separation unit 721, and the audio processing unit 725 processes the decoded audio signal output from the audio decoding unit 723.

The video decoding unit 727 decodes the video signal output from the broadcast separation unit 721, and the audio processing unit 729 processes the decoded video signal output from the video decoding unit 727.

The GUI generation unit 760 generates a GUI to be displayed on a display unit. The generated GUI is transmitted to the video processing unit 729, and added to video displayed on the display unit.

The output unit 730 comprises an audio output unit 731, and a video output unit 735. The audio output unit 731 outputs the audio signal output from the audio processing unit 725 through the speaker. The video output unit 735 outputs the video signal output from the video processing unit 729 on the display unit.

The user command receiving unit 740 transmits a user command received from a remote control to the control unit 750. The control unit 750 controls the entire operation of the digital television 700 according to the user command received from the user command receiving unit 740.

The audio processing unit 725 may be implemented with the audio signal processing apparatus as described above.

In addition, the video processing unit 729 may also be implemented with the technical idea presented based on the audio signal processing apparatus as described above.

Another exemplary embodiment of the present invention is described in detail with reference to FIGS. 8 and 9.

Figure 8:
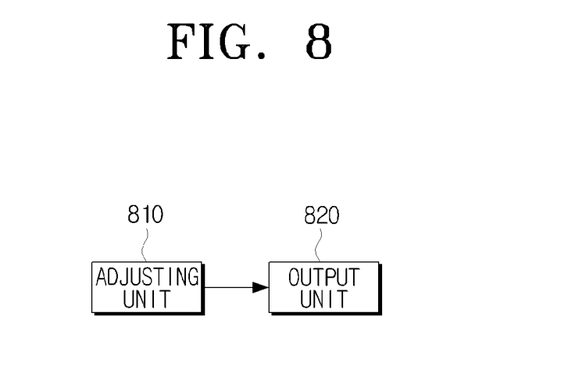
FIG. 8 is a block diagram illustrating an electronic apparatus according to the fourth exemplary embodiment of the present invention.

As shown in FIG. 8, an electronic apparatus according to the fourth exemplary embodiment of the present invention comprises an adjusting unit 810, and an output unit 820.

The adjusting unit 810 adjusts the level of a certain signal from among sequentially input signals based on the levels of the signals. The output unit 820 outputs the certain signal level adjusted by the adjusting unit 810. The certain signal is one of signals input prior to the latest signal input to the adjusting unit 810.

The electronic apparatus may be an audio signal processing apparatus, a video signal processing apparatus, an audio apparatus, a television, or a set-top box.

Figure 9:
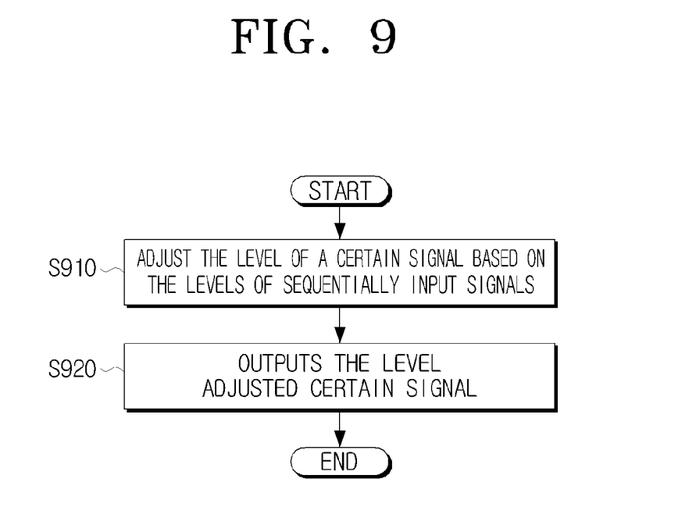
FIG. 9 is a flow chart illustrating a signal processing method according to the fifth exemplary embodiment of the present invention.

In a signal processing method of FIG. 9, the electronic apparatus adjusts the level of a certain signal based on the levels of sequentially input signals in operation S910. In operation S920, the electronic apparatus outputs the certain signal level adjusted in operation S910. The certain signal is one of signals input prior to the latest input signal.

As a result, the level of the certain signal can be adjusted using signals sequentially following the certain signal.

As can be appreciated from the above description, a storage cell is shared for lip-sync and AVC, resulting in reduced manufacturing costs. In addition, the level of a certain signal is adjusted using signals sequentially following the certain signal, so stabilization of the signal and the rate of the stabilization of the signal are enhanced. Consequently, the present invention can provide users with superior audio and video.

The foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A signal processing apparatus comprising:
an adjusting unit which calculates a root mean square value of signal levels of sequentially input signals that are delayed and stored prior to the sequentially input signals being input into a root mean square value calculation unit, and adjusts a certain signal by adjusting a signal level of the certain signal from among the sequentially input signals, based on the root mean square value; and
an output unit which outputs the adjusted certain signal,
wherein the certain signal is one of sequentially input signals input into the adjusting unit prior to an input of a latest signal of the sequentially input signals.

2. The signal processing apparatus of claim 1, wherein the adjusting unit stores the sequentially input signals in First In First Out (FIFO) manner, and the certain signal is an earliest input signal from among the sequentially input signals which are input and stored in the adjusting unit.

3. The signal processing apparatus of claim 1, wherein the certain signal is an audio signal.

4. The signal processing apparatus of claim 3, wherein the sequentially input signals are sequentially input audio signals,
the adjusting unit comprises:
a delay unit which delays and stores the sequentially input audio signals; and
a level adjusting unit which adjusts the signal level of the audio signal which is delayed for a period of time in the delay unit and output,
wherein the period of time is a period in which the audio signal is delayed to synchronize the sequentially input audio signals and video signals of moving images.

5. The signal processing apparatus of claim 1, wherein the adjusting unit comprises:
a delay unit which delays and stores the sequentially input signals;
and
a level adjusting unit which applies the calculated gain to the certain signal output from the delay unit.

6. The signal processing apparatus of claim 5, wherein the delay unit comprises storage units where the sequentially input signals are delayed and stored,
and the storage units are implemented in at least one of hardware and software.

7. The signal processing, apparatus of claim 1, wherein the adjusting unit adjusts the signal level of the certain signal from among the sequentially input signals based on weighted levels which are applied to the signal levels of the sequentially input signals.

8. A signal processing method comprising:
calculating a root mean square value of signal levels of sequentially input signals that are delayed and stored prior to the calculating of the root mean square value of the signal levels of the sequentially input signals;
adjusting a certain signal by adjusting a signal level of the certain signal from among the sequentially input signals, based on the root mean square value; and
outputting the adjusted certain signal,
wherein the certain signal is one of the sequentially input signals input prior to an input of a latest input signal of the sequentially input signals.

9. The signal processing method of claim 8, wherein in the adjusting, the sequentially input signals are stored in First In First Out (FIFO) manner, and the certain signal is an earliest input signal from among the sequentially input signals which are input and stored in the adjusting.

10. The signal processing method of claim 8, wherein the certain signal is an audio signal.

11. The signal processing method of claim 10, wherein the sequentially input signals are sequentially input audio signals,
the adjusting comprises:
delaying and storing the sequentially input audio signals; and
adjusting the signal level of the certain audio signal which is delayed for a period of time in the delaying and output,
wherein the period of time is a period in which the certain audio signal is delayed to synchronize the sequentially input audio signals and video signals of moving images.

12. The signal processing method of claim 8, wherein the adjusting comprises:
delaying and storing the sequentially input signals;
calculating a gain for the certain signal based on the stored sequentially input signals; and
applying the calculated gain to the certain signal.

13. The signal, processing method of claim 8, wherein in the adjusting, the signal level of the certain signal from among the sequentially input signals is adjusted based on weighted levels which are applied to the signal levels of the sequentially input signals.

14. The signal processing method of claim 8, wherein the adjusting and the outputting are performed by one of a signal processing apparatus, an audio apparatus, an audio/video apparatus, a television, and a set-top box.

15. An audio apparatus which processes and outputs audio signals, the apparatus comprising:
a root mean square value calculation unit which calculates a root mean square value of signal levels of sequentially input audio signals that are delayed and stored prior to the sequentially input signals being input into the root mean square value calculation unit;
an adjusting unit which adjusts a certain audio signal by adjusting an audio signal level of the certain audio signal from among the sequentially input audio signals based on the root mean square value; and
an output unit which outputs the adjusted certain audio signal,
wherein the certain audio signal is one of the sequentially input audio signals input into the adjusting unit prior to a latest audio signal of the sequentially input audio signals.

16. An audio/video apparatus which processes and outputs audio signals and video signals, the apparatus comprising:
a root mean square value calculation unit which calculates a root mean square value of signal levels of sequentially input audio signals that are delayed and stored prior to the sequentially input signals being input into the root mean square value calculation unit;
an adjusting unit which adjusts a certain signal by adjusting an audio signal level of the certain audio signal from among the sequentially input audio signals based on the root mean square value; and
an output unit which outputs the adjusted certain audio signal,
wherein the certain audio signal is one of audio signals of the sequentially input audio signal input into the adjusting unit prior to a latest audio signal of the sequentially input audio signals.

17. The audio/video apparatus of claim 16, wherein the audio/video apparatus is one of a television, a set-top box, and a broadcast receiving apparatus.

18. The signal processing apparatus of claim 1, wherein the root mean square value calculation unit calculates the gain based on the root mean squared value.

\* \* \* \* \*